United States Patent
Schlereth et al.

(10) Patent No.: US 10,731,797 B2
(45) Date of Patent: Aug. 4, 2020

(54) FILAMENT WITH LIGHT-EMITTING SEMICONDUCTOR CHIPS, LIGHTING MEANS AND METHOD OF PRODUCING A FILAMENT

(71) Applicant: OSRAM OLED GmbH, Regensburg (DE)

(72) Inventors: Thomas Schlereth, Regensburg (DE); Elena Rachkova, Pielenhofen (DE); Michael Bestele, Lappersdorf (DE); Ivar Tangring, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/087,949

(22) PCT Filed: Mar. 23, 2017

(86) PCT No.: PCT/EP2017/056985
§ 371 (c)(1),
(2) Date: Sep. 24, 2018

(87) PCT Pub. No.: WO2017/162821
PCT Pub. Date: Sep. 28, 2017

(65) Prior Publication Data
US 2019/0113181 A1    Apr. 18, 2019

(30) Foreign Application Priority Data
Mar. 24, 2016 (DE) .................. 10 2016 105 537

(51) Int. Cl.
*F21K 9/232* (2016.01)
*H01L 25/075* (2006.01)
(Continued)

(52) U.S. Cl.
CPC .............. *F21K 9/232* (2016.08); *F21K 9/275* (2016.08); *H01L 25/0753* (2013.01);
(Continued)

(58) Field of Classification Search
CPC ...... F21K 9/232; F21K 9/275; H01L 25/0753; H01L 33/50; H01L 33/54; H01L 33/62
See application file for complete search history.

(56) References Cited

U.S. PATENT DOCUMENTS

2009/0321759 A1    12/2009  Xu
2011/0058372 A1     3/2011  Lerman et al.
(Continued)

FOREIGN PATENT DOCUMENTS

CN    103210490 A    7/2013
CN    203273326 U   11/2013
(Continued)

OTHER PUBLICATIONS

German Search Report dated Dec. 16, 2016, of corresponding German Application No. 10 2016 105 537.9.
First Office Action dated Nov. 5, 2019, of counterpart Chinese Application No. 201780019584.9, along with an English translation.

*Primary Examiner* — Thomas M Sember
(74) *Attorney, Agent, or Firm* — DLA Piper LLP (US)

(57) ABSTRACT

A filament includes a multiplicity of light-emitting semiconductor chips, wherein the semiconductor chips are arranged on a carrier, the semiconductor chips being electrically contacted, a scattering structure is configured to scatter light of the light-emitting semiconductor chips, the scattering structure is formed by structuring a surface, a converter covers the light-emitting semiconductor chips, and the structuring of the surface is formed on a surface of the converter.

20 Claims, 8 Drawing Sheets

(51) Int. Cl.

| | | |
|---|---|---|
| *F21K 9/275* | (2016.01) | |
| *H01L 33/54* | (2010.01) | |
| *H01L 33/50* | (2010.01) | |
| *H01L 33/62* | (2010.01) | |
| *F21Y 115/10* | (2016.01) | |
| *F21Y 103/10* | (2016.01) | |

(52) U.S. Cl.
CPC .............. *H01L 33/50* (2013.01); *H01L 33/54* (2013.01); *H01L 33/62* (2013.01); *F21Y 2103/10* (2016.08); *F21Y 2115/10* (2016.08); *H01L 33/505* (2013.01); *H01L 2933/005* (2013.01); *H01L 2933/0041* (2013.01); *H01L 2933/0091* (2013.01)

(56) References Cited

U.S. PATENT DOCUMENTS

| | | |
|---|---|---|
| 2014/0197441 A1 | 7/2014 | Ye et al. |
| 2014/0268739 A1 | 9/2014 | Veres et al. |
| 2014/0369036 A1 | 12/2014 | Feng |
| 2016/0300820 A1 | 10/2016 | Sabathil et al. |

FOREIGN PATENT DOCUMENTS

| | | |
|---|---|---|
| CN | 203895450 U | 10/2014 |
| DE | 10 2014 100 584 A1 | 7/2015 |
| EP | 2 911 194 A1 | 8/2015 |
| JP | 2009-4698 A | 1/2009 |
| JP | 2012-146738 A | 8/2012 |
| WO | 2012/027616 A2 | 3/2012 |

FILAMENT WITH LIGHT-EMITTING SEMICONDUCTOR CHIPS, LIGHTING MEANS AND METHOD OF PRODUCING A FILAMENT

TECHNICAL FIELD

This disclosure relates to an arrangement of light-emitting semiconductor chips, for example, in a filament for a lighting means, a lighting means having such a filament and a method of producing such a filament.

BACKGROUND

A filament refers to a carrier having semiconductor chips. One or more filaments are suitable for being integrated into a lighting means and replacing the classical incandescent filament.

Light-emitting semiconductor chips, also referred to as LEDs, constitute a light source with good efficiency since they convert a large fraction of the required electrical current into light. In recent years, lighting means with such light-emitting semiconductor chips, which appear similar to conventional incandescent bulbs and can also be used like conventional incandescent bulbs, have been developed. In this case, so-called LED filaments are used, in which a multiplicity of light-emitting semiconductor chips are arranged on a common linear substrate. In the on state, such lighting means act in a similar way to conventional incandescent bulbs. One disadvantage of that approach is that previously known LED filaments differ greatly in their emission profile from conventional filaments for conventional incandescent bulbs, and the optical impression is thus different.

It could therefore be helpful to provide an improved filament for a lighting means having light-emitting semiconductor chips, the emission characteristic of which approximates the emission characteristic of the classical incandescent filament of a conventional incandescent bulb, as well as to provide a lighting means having such a filament and a method of producing such a filament.

SUMMARY

We provide a filament including a multiplicity of light-emitting semiconductor chips, wherein the semiconductor chips are arranged on a carrier, the semiconductor chips being electrically contacted, a scattering structure is configured to scatter light of the light-emitting semiconductor chips, the scattering structure is formed by structuring a surface, a converter covers the light-emitting semiconductor chips, and the structuring of the surface is formed on a surface of the converter.

We also provide a lighting means including the filament, an envelope made of a transparent material, and an electrical contacting, wherein the electrical contacting electrically conductively connects to the filament, and the envelope is filled with a gas.

We further provide a method of producing the filament, wherein the converter is produced by an injection-molding method, the structuring of the surface of the converter being achieved by the shape of the injection-molding tool.

Figure 1:
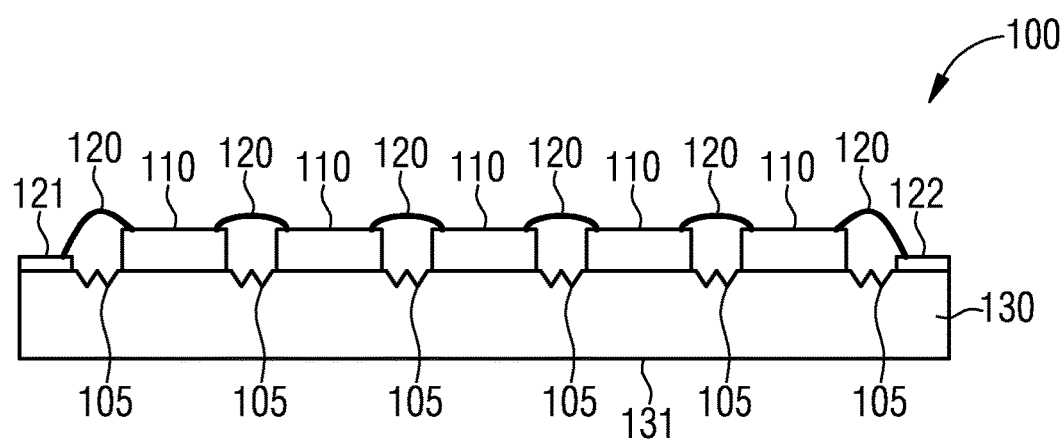
FIG. 1 schematically shows a plan view of a filament with light-emitting semiconductor chips.

LIST OF REFERENCES 100 filament
105 scattering structure
110 semiconductor chip
120 bonding wire
121 first contact position
122 second contact position
130 carrier
131 lower side of the carrier
132 convex lower side of the carrier
133 concave lower side of the carrier
134 triangular recesses
135 pyramidal structure
136 recess
137 upper side of the carrier
140 converter
141 surface of the converter
142 front side of the converter
143 lateral face
144 converter platelet
200 lighting means
210 envelope
220 electrical contacting

DETAILED DESCRIPTION

Our filament has a multiplicity of light-emitting semiconductor chips arranged on a carrier. The semiconductor chips are electrically contacted, and a scattering structure is provided, the scattering structure being configured to scatter light of the light-emitting semiconductor chips. The scattering structure is formed by structuring a surface. Light-emitting semiconductor chips have an emission characteristic of the emitted light which is angle-dependent. In contrast thereto, the emission characteristic of a conventional filament is relatively independent of the emission angle. By the scattering structure, which is formed by the structure of a surface of the filament, light of the light-emitting semiconductor chips, which would otherwise leave the filament linearly, can be scattered in different directions and a more uniform emission characteristic can thus be achieved. The structuring of the surface, to produce the scattering structure, represents a simple possibility of forming the emission characteristic angle-independently since structuring of a surface can be carried out relatively simply in mechanical terms.

A converter may be provided, the converter covering the light-emitting semiconductor chips. The structuring of the surface is formed on a surface of the converter. The converter is used to shift the light of the light-emitting semiconductor chips in its wavelength, particularly to produce white light. The converter is highly suitable for forming the scattering structure.

The converter may enclose the carrier with the light-emitting semiconductor chips. This is advantageous in particular when the electrical contacting of the semiconductor chips is carried out by bonding wires, and the bonding wires can be enclosed by the converter to enhance mechanical stability of the bonding wires. In this case, a part of the surface or the entire surfaces of the converter may be formed with a scattering structure.

The converter may have a cylindrical shape. The structuring of the surface is formed by structuring at least a part of the lateral face of the cylindrical shape of the converter. By the cylindrical shape of the converter, a structured surface is produced so that the emission characteristic is improved in relation to a rotation angle about the lateral face. In this case, the light intensity may be increased by a factor of 2 for some solid angles.

Structuring the lateral face may be rotationally symmetrical about a cylinder axis. Such a rotationally symmetrical scattering structure can be produced simply, and is therefore advantageous for the scattering structure of the converter. The cylinder axis may in this case lie on an axis through the carrier or on an axis through the semiconductor chips.

The scattering structure of the lateral face may in this case have one or more indentations extending from the lateral face. The indentations may in this case be formed rotationally symmetrically about the cylinder axis. A width of the indentations may in this case be 0.2 to 2 millimeters. A depth of the indentations may likewise be 0.2 to 2 millimeters.

The indentations may have a triangular cross section. A semicircular or parabolic cross section may likewise be provided.

Structuring the surface of the converter may have a size of 0.2 to 2 millimeters. Such a size has been found to be advantageous for the emission characteristic of the filament.

The emission characteristic approximates the emission characteristic of a classical incandescent filament in particular when the lateral face of a cylindrical conversion element, which encloses the carrier with the semiconductor chips, is structured with indentations such that the indentations adjoin one another and the entire lateral face is provided with indentations. In particular, the emission characteristic radially with respect to the cylinder axis can be improved in this way.

The cylinder axis may extend through the carrier or through the semiconductor chips.

The carrier may comprise a material having a transmissivity for the light of the light-emitting semiconductor chips of at least 70%. A lower side of the carrier is the side of the carrier facing away from the semiconductor chips. Structuring the surface is structuring of the lower side of the carrier. In other words, the semiconductor chips are arranged on one side of the carrier and the side of the carrier opposite the semiconductor chips is structured to produce the scattering structure. If a converter is to be provided, transmissivity for the light of the light-emitting semiconductor chips should likewise be usable for the light generated by the conversion. This means that the light converted by the converter is also transmitted to at least 70% through the carrier. With such a scattering structure, the emission characteristic for light which does not leave the filament on a normal of the carrier, is improved. In this case, improvements of up to 5% are possible.

Because of the light-transmitting carrier and the scattering structure on the lower side of the carrier, the filament can have an improved angular emission characteristic for the emitted light.

Structuring the lower side of the carrier may be formed by a convex shape of the lower side or a concave shape of the lower side. Convex and/or concave shapes of the lower side may in this case be used as a scattering structure which influences the emission characteristic for different emission angles.

The carrier may in this case have a first extent direction along a row of the semiconductor chips and a second extent direction transversely to the row of the semiconductor chips.

A width of the carrier in the second extent direction may be 1 to 2 millimeters. The lower side of the carrier is shaped convexly such that a cross section of the carrier is formed from a rectangle with a circle segment adjacent to the rectangle. A height of the circle segment may in this case be 8 to 12 percent of the width. As an alternative to the circle segment, a parabolic face adjacent to the rectangle may also be provided, the height of which face may likewise be 8 to 12 percent of the width.

A lower side of the carrier may have a recess, which is triangular in cross section, parallel to a first extent direction. The first extent direction is in this case defined along the carrier and the semiconductor chips. Such a triangular recess also constitutes a scattering structure with which the emission characteristic for different emission angles can be improved. A first contact position and a second contact position may be arranged at different ends of the carrier in relation to the first extent direction.

The triangle of the recess may be an isosceles triangle. The carrier may have a plurality of recesses that are triangular in cross section.

The multiplicity of recesses that are triangular in cross section may in this case be formed identically or differently. It is furthermore possible for the recesses to be arranged periodically or nonperiodically on the lower side.

The effect of the isosceles triangle is that the emission characteristic is symmetrical with respect to a plane through the carrier and the semiconductor chips. The plurality of recesses further improve the emission characteristic for different solid angles.

The carrier may again have the first extent direction. The lower side of the carrier has a plurality of recesses, which are triangular in cross section, transversely to the first extent direction. For such an arrangement of the recesses as well, the emission characteristic of the filament for different emission angles can be improved.

A side of the triangle lying on the lower side of the carrier may have dimensions of 0.2 to 1 millimeters. We found this size of the recesses to be particularly advantageous in improving the emission characteristic for different emission angles.

Structuring the lower side of the carrier may have a pyramidal structure. This may, for example, be produced by forming triangular recesses of the lower side parallel to the first extent direction and transversely to the first extent direction. This leads to pyramidal structures on the lower side. We found these pyramidal structures to be advantageous for the emission characteristic of the filament.

The entire lower side of the carrier may be covered with a plurality of pyramidal structures. The pyramidal structure may have dimensions of 0.2 to 1 millimeters. In this case as well, these dimensions have been found to be advantageous for the emission characteristic.

The filament may have both one of the described structurings of the surface of the converter and one of the described structurings of the lower side of the carrier. The combination of the two structurings leads to a particularly advantageous emission characteristic of the filament.

A lighting means has one of the described filaments, an envelope made of a transparent material and electrical contacting. The electrical contacting is electrically conductively connected to the filament. The envelope is filled with a gas, the gas being used to conduct waste heat, which is given off during operation of the light-emitting semiconductor chips, to the envelope wall to cool the light-emitting semiconductor chips. This is necessary in particular since the materials used for the substrate, with a transmissivity for the light of the light-emitting semiconductor chips, or of the converter, of at least 70%, generally have a poor thermal conductivity. A lighting means having such an arrangement and such a filament appears very similar to a classical incandescent bulb, compared to lighting means with LED filaments of a conventional design.

In one method of producing a filament, the converter is produced by an injection-molding process. Structuring the surface of the converter is achieved by the shape of the injection-molding tool. Structuring the surface of the converter by an injection-molding tool is a simple and technically very controllable method of producing a converter with a structured surface.

In one method of producing a filament, structuring the lower side of the carrier is produced by a sawing, grinding, etching or laser-structuring process. In this case in particular, a frosted glass-like matte surface of the carrier is produced by a sawing, grinding, etching or laser-structuring process. When using the etching process, it is possible to obtain both a frosted glass-like but also a polished surface.

The above described properties, features and advantages, as well as the way in which they are achieved, will become more clearly and readily comprehensible in connection with the following description of examples, which will be explained in more detail in connection with the drawings.

FIG. 1 shows a lateral plan view of a filament 100. A plurality of light-emitting semiconductor chips 110 are fitted on a carrier 130. At one end of the carrier 130, there is a first electrical contact position 121, and at the opposite end of the carrier 130 there is a second electrical contact position 122. The light-emitting semiconductor chips 110 electrically conductively connect to one another by bonding wires 120, and the respective outermost light-emitting semiconductor chips 110 electrically conductively connect by a further bonding wire 120, respectively, to the electrical contact positions 121, 122. Arranged between the semiconductor chips 110, there is, respectively, a scattering structure 105 consisting of a plurality of indentations of the carrier. Such a scattering structure 105 is also arranged between the contact positions 121, 122 and the respectively adjoining semiconductor chips 110. The scattering structure 105 is thus formed by structuring a surface. A scattering structure, which is formed by structuring the lower side 131, i.e. of a surface of the carrier 130, may likewise be provided on the lower side 131, opposite to the semiconductor chips 110, of the carrier 130. This structuring may, for example, be formed by grinding or etching of the lower side 131 of the carrier so that a matte surface is imparted to the carrier 130. One example of a material of the carrier 130 may in this case be glass and/or sapphire.

Any other type of carrier 130 with at least two semiconductor chips 110 arranged on the carrier 130 may also be regarded as a filament 100. The nature of the electrical contacting and the electrical line routing may be configured differently.

Figure 2:
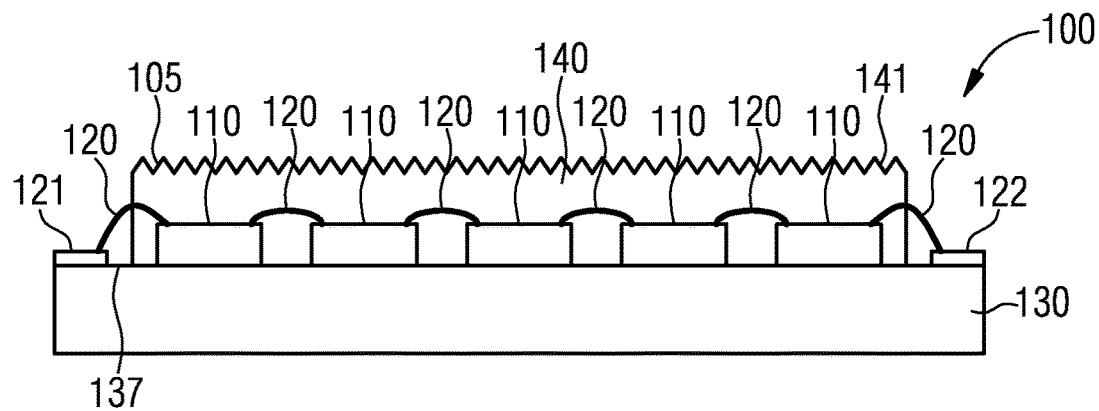
FIG. 2 schematically shows a cross section through a filament with a converter with a structured surface.

FIG. 2 shows another cross section through a filament 100 with a plurality of light-emitting semiconductor chips 110 on a carrier 130. The semiconductor chips 110 electrically conductively connect by bonding wires 120. In addition, the semiconductor chips 110 are covered with a converter 140, the converter 140 being arranged on the upper side 137 of the carrier 130 and covering the majority of the upper side 137. A surface 141, facing away from the carrier 130, of the converter 140 is structured in shape and therefore forms a scattering structure 105 of the filament 100. Recesses, elevations or roughening of the surface 141 may be envisioned as shapes of the structuring.

Figure 3:
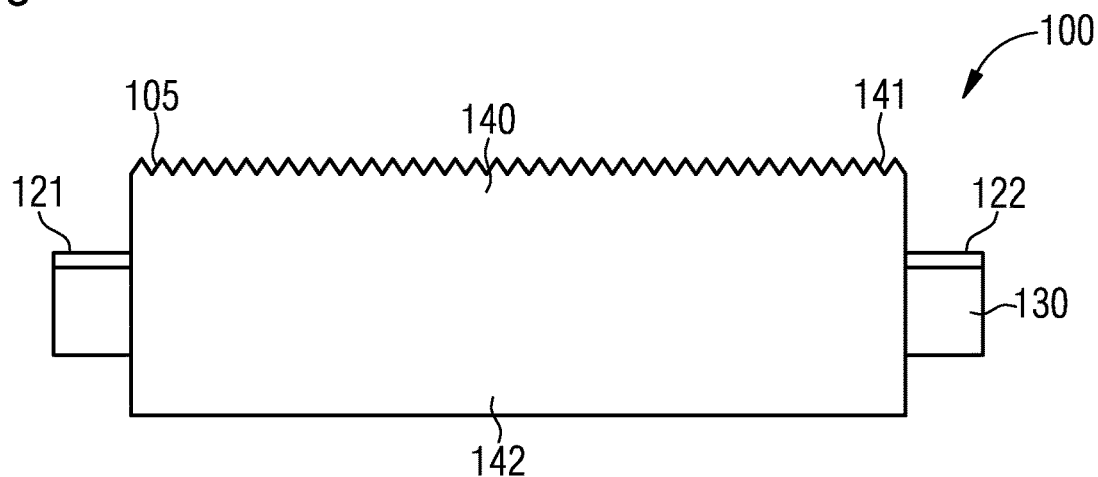
FIG. 3 schematically shows a plan view of a filament in which the converter encloses the carrier.

FIG. 3 shows a plan view of another example of a filament 100. A carrier 130 has electrical contact positions 121, 122 at the ends. The converter 140 encloses the carrier 130 with the light-emitting semiconductor chips 110, which are no longer represented for this reason, are located inside the converter 140 and, for example, are configured as represented in FIG. 1. The semiconductor chips 110 and the bonding wires 120 are covered by a front side 142 of the converter 140. The converter 140 may in this case have an essentially cuboid shape, a surface 141, arranged above the light-emitting semiconductor chips 110 of the converter being structured. The surface 141 thus forms the scattering structure 105. Since the light-emitting semiconductor chips 110 and the bonding wires 120 are enclosed by the converter 140, a mechanical stability of the bonding wires 120 can be achieved so that the filament 100 as a whole becomes mechanically more stable.

Instead of the scattering structure 105 represented in FIG. 3, which extends over the entire surface 105, the scattering structure 105 may extend only over a partial face of the converter 140. Alternating regions of structured and unstructured surfaces may also be envisioned.

Figure 4:
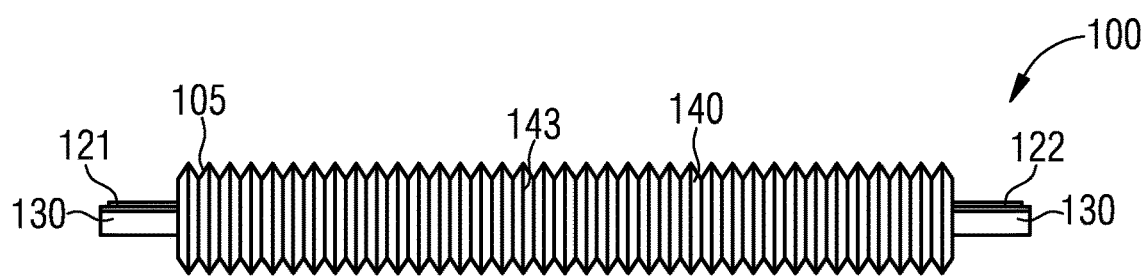
FIG. 4 schematically shows a plan view of a filament in which the entire lateral face of the converter, produced by the cylindrical shape of the converter, is structured.

FIG. 4 shows another filament 100 with a carrier 130, and with a first electrical contact position 121 at one end of the carrier 130 and a second electrical contact position 122 at the second end of the carrier 130. The converter 140 has a cylindrical shape. Structuring the surface of the converter is structuring the entire lateral face 143 of the cylindrical shape of the converter 140. The structured lateral face 143 forms the scattering structure 105. The converter 140 in turn encloses the light-emitting semiconductor chips 110 and the bonding wires 120, which for this reason are likewise not represented in FIG. 4. The scattering structure 105 may not be formed on the entire lateral face 143.

In one example, structuring the lateral face 143 is rotationally symmetrically about an axis of the cylinder. This is likewise indicated in in FIG. 4. It is, however, also possible to provide structuring of the lateral face 143 which is not rotationally symmetrical.

The scattering structure 105 of the lateral face 143 may in this case have one or more indentations 105 extending from the lateral face 143. The indentations 105 may in this case be formed rotationally symmetrically about the cylinder axis. A width of the indentations 105 may in this case be 0.2 to 2 millimeters. A depth of the indentations 105 may likewise be 0.2 to 2 millimeters.

The indentations 105 may have a triangular cross section as represented in FIG. 4. A semicircular or parabolic cross section may likewise be provided.

The cylinder axis may extend through the carrier 130 or through the semiconductor chips 110.

As an alternative to the scattering structure 105 of FIG. 4, the converter 140 may have a cylindrical shape, but the scattering structure 105 is not arranged rotationally symmetrically. For example, an indentation could be provided that extends from the lateral face 143 and is arranged extending around in the shape of a coil or spiral on the lateral face 143. The indentation may in this case be displaced by one width of the indentation at each revolution.

It is likewise possible to provide two or more indentations spirally on the lateral face 143.

The indentations 105 of FIG. 4 may not adjoin one another directly, but instead unstructured regions of the lateral face 143 may be provided between them. This is likewise possible for the spiral structurings of the lateral face 143.

Figure 5:
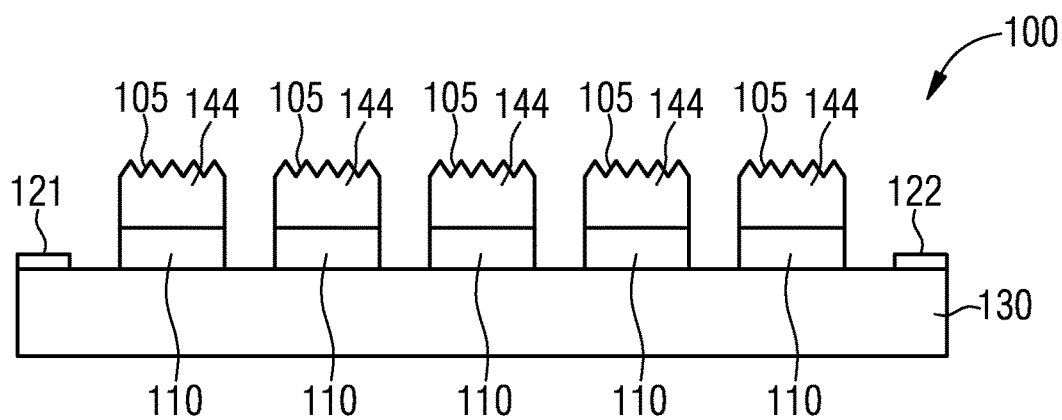
FIG. 5 schematically shows a plan view of a filament with converter platelets with structuring.

FIG. 5 shows a filament 100 with light-emitting semiconductor chips 110 on a carrier 130, the carrier 130 having electrical contact positions 121, 122. The semiconductor chips 110 respectively have a converter platelet 144. A surface of the converter platelets 144, namely the surface facing away from the light-emitting semiconductor chips 110, is structured and forms the scattering structure 105.

In one example, the carrier 130 comprises a material with a transmissivity for the light of the light-emitting semiconductor chips 110 and/or of the light produced by conversion of the light-emitting semiconductor chips 110 inside the converter 140, of at least 70%. Glass or sapphire, for example, may in this case be envisioned as materials for the carrier 130, both materials having the required transmissivities for visible light.

Figure 6:
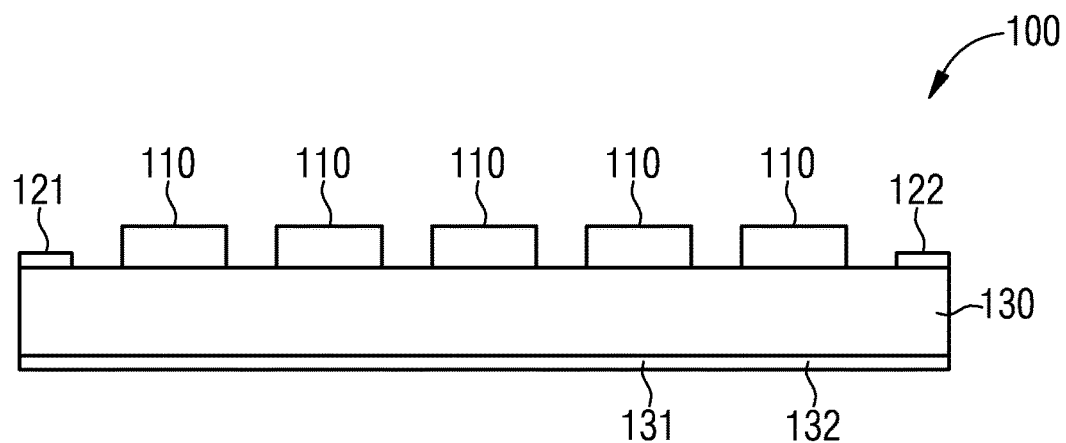
FIG. 6 schematically shows a plan view of a filament with a convex lower side.

FIG. 6 shows a plan view of a filament 100 with light-emitting semiconductor chips 110, and a first electrical contact position 121 and a second electrical contact position 122, which is respectively arranged on a carrier 130. The electrical contacting of the light-emitting semiconductor chips is not represented in FIG. 6, but may be produced in a similar way to FIG. 1 with bonding wires, or alternatively by conductor tracks on the carrier 130. The electrical contacting of the light-emitting semiconductor chips is no longer referred to in what follows.

A convex lower side 132 of the carrier constitutes structuring the lower side 131 of the carrier, which forms the scattering structure 105.

Figure 7:
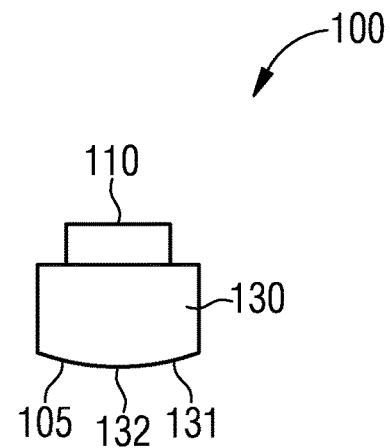
FIG. 7 schematically shows a cross section through a filament with a convex lower side.

FIG. 7 shows a cross section through the filament 100 of FIG. 6. The carrier 130, with the convex lower side 132 and a light-emitting semiconductor chip 110 fitted on the opposite side of the carrier 130, is represented.

In one example, a width of the carrier 130 in the second extent direction is 1 to 2 millimeters. The lower side 132 of the carrier is shaped convexly such that a cross section of the carrier 130 is formed from a rectangle with a circle segment adjacent to the rectangle. A height of the circle segment may in this case be 8 to 12 percent of the width. As an alternative to the circle segment, a parabolic face adjacent to the rectangle may also be provided, the height of which face may likewise be 8 to 12 percent of the width. This scattering structure formed by the convex lower side 132 may extend over the entire carrier in the first extent direction.

It is possible to combine the scattering structure 105 of the convex lower side 132 of FIGS. 6 and 7 with the scattering structure 105 of the converter 140 of FIG. 4.

Figure 8:
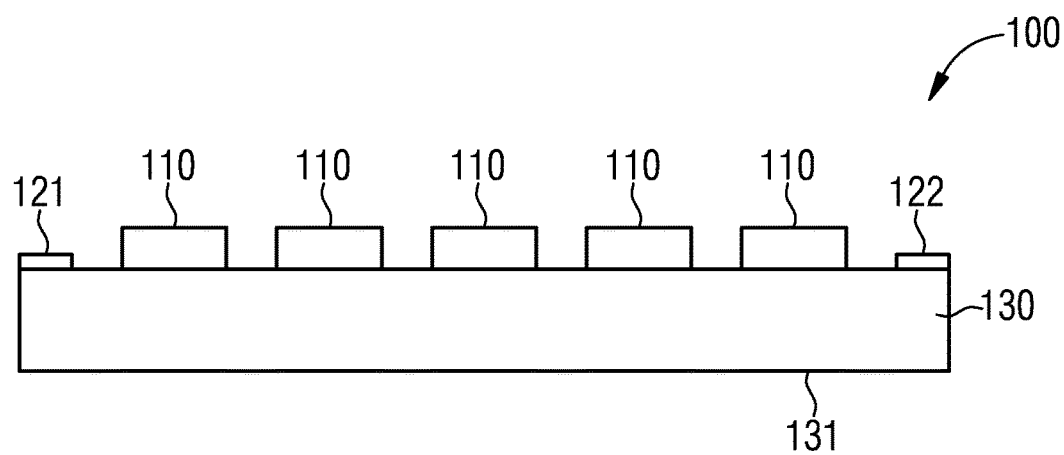
FIG. 8 schematically shows a plan view of a filament with a concave lower side.
Figure 9:
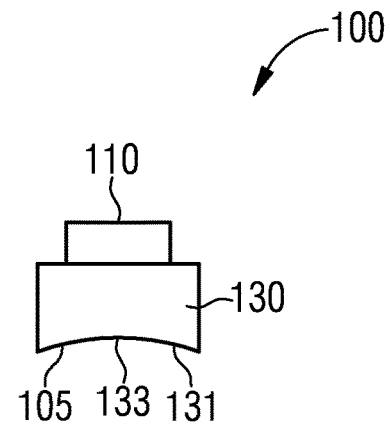
FIG. 9 schematically shows a cross section through a filament with a concave lower side.

FIG. 8 shows a filament 100 in which the lower side 131 of the carrier 130 has a concave shape. Because of the concave shape of the lower side 131 and the fact that FIG. 8 is a plan view of a filament 100, the concave shape of the lower side 131 is not visible since it is covered by the front side of the carrier 130. Light-emitting semiconductor chips 110 and electrical contact positions 121, 122 are again arranged on the side of the carrier opposite to the lower side 131. FIG. 9 shows a cross section through the filament 100 of FIG. 8. The carrier 130 has a concave lower side 133, and a light-emitting semiconductor chip 110 is arranged on the side opposite to the concave lower side 133.

The concave or convex shape of the lower side 131 of the carrier 130 may also be achieved by facets.

Figure 10:
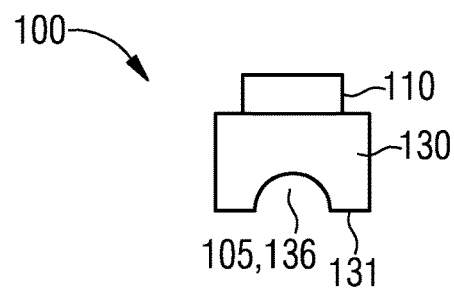
FIG. 10 schematically shows a cross section through a filament with a recess of the lower side parallel to the first extent direction.

FIG. 10 shows a cross section through a filament in which the scattering structure 105 is formed as a recess 136 on the lower side 131 of the carrier 130. The recess 136 in this case has a semicircular cross section, although other cross sections may also be envisioned. From the site, this example corresponds to the example of FIG. 8.

Likewise, a plurality of recesses may form the scattering structure 131 in a similar way to the recess 136 of FIG. 10 on the lower side 131 of the carrier 130. The recesses may in this case be identical or nonidentical. Furthermore, the recesses may be arranged periodically or nonperiodically.

Figure 11:
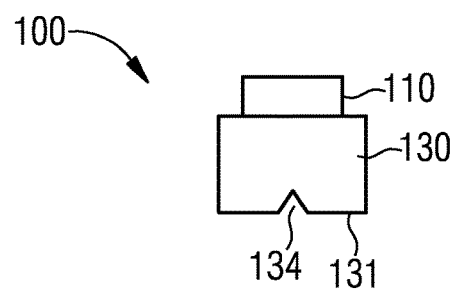
FIGS. 11 to 13 schematically show cross sections through filaments with one or more triangular recesses of the lower side parallel to the first extent direction.
Figure 12:
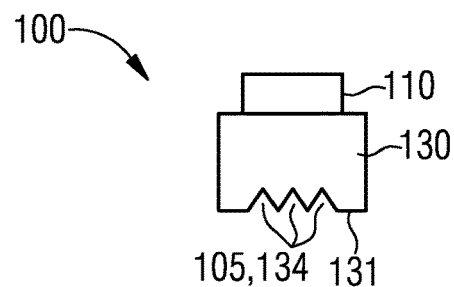
Figure 13:
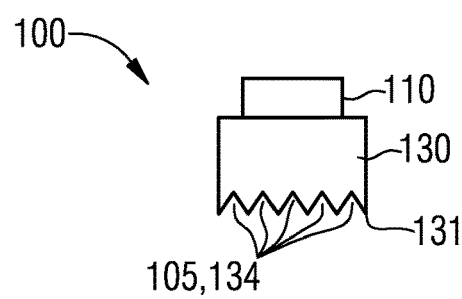

FIGS. 11 to 13 respectively show a cross section through a filament with recesses 134 on the lower side 131 of the carrier 130. The side views of these filaments 100 again correspond to FIG. 8. The recesses 134 are in this case one or more recesses 134, triangular in cross section, on the lower side 131. A light-emitting semiconductor chip 110 is fitted on the side of the carrier 130 opposite to the lower side 131. The filament 100 of FIG. 11 in this case has a recess 134 which is triangular in cross section. The filament 100 of FIG. 12 has three mutually adjacent recesses 134 which are triangular in cross section. The filament 100 of FIG. 12 has five recesses 134, triangular in cross section, lying next to one another, the five triangular recesses 134 covering the entire lower side 131 of the carrier in FIG. 12.

Figure 14:
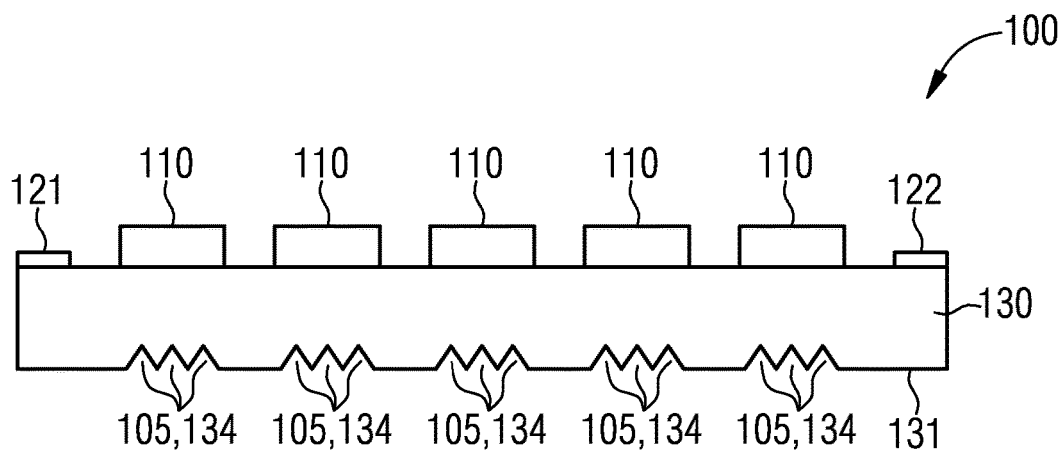
FIG. 14 schematically shows a plan view of a filament with a plurality of triangular recesses of the lower side transversely to the first extent direction.

FIG. 14 shows another example of a filament 100. The features of the filament 100 of FIG. 14 correspond essentially to the features of FIG. 10. In contrast to FIG. 10, in the example of FIG. 14, recesses which are triangular in cross section are arranged parallel to the first extent direction, the triangular recesses 134 respectively being arranged below the light-emitting semiconductor chips 110. Between the regions of the triangular recesses 134, there are further regions, in which no recess is arranged, on the lower side 131 of the carrier 130.

Figure 15:
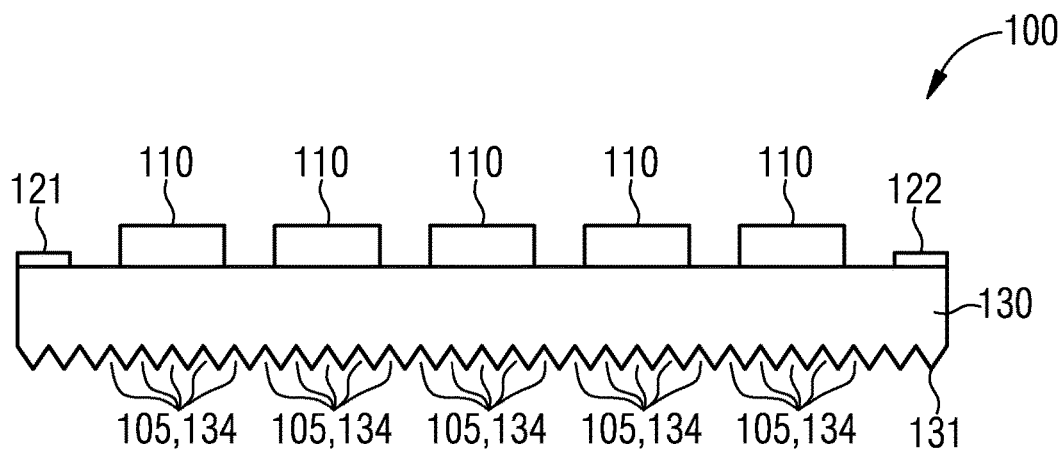
FIG. 15 schematically shows a plan view of a filament in which the entire lower side is covered with triangular recesses transversely to the first extent direction.

FIG. 15 shows another example of a filament 100 in which the entire lower side 131 of the carrier 130 is covered with triangular recesses 134, and which otherwise corresponds to the example of FIG. 14.

The triangle of the triangular recess 134 may be an isosceles triangle or the triangle may not be isosceles.

A side of the triangle may be 0.2 to 1 millimeters in size. We found recesses of this order of magnitude to be particularly advantageous for scattering light of the light-emitting semiconductor chips or of the converter 140.

Figure 16:
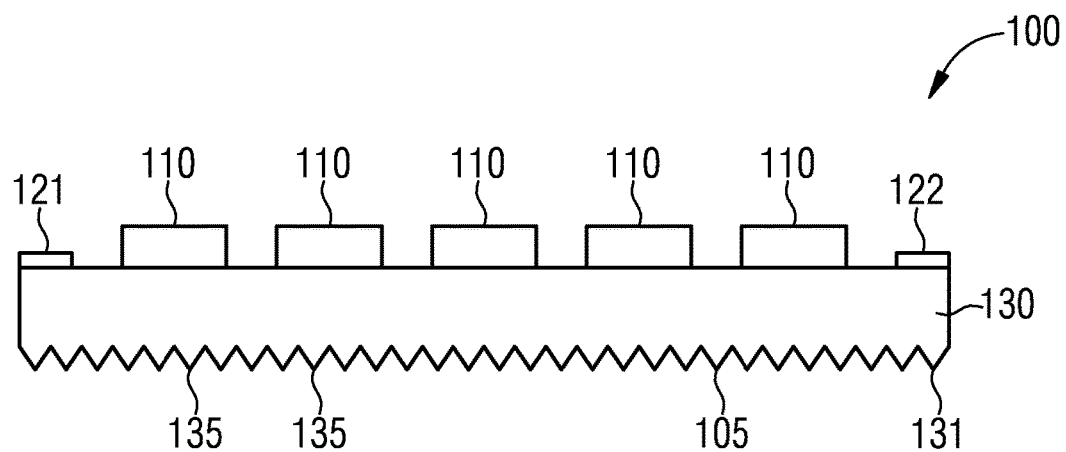
FIG. 16 schematically shows a plan view of a filament with pyramidal structures of the lower side.
Figure 17:
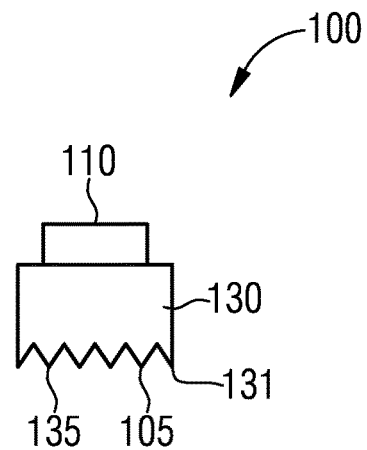
FIG. 17 schematically shows a cross section through a filament with pyramidal structures on the lower side of the carrier.
Figure 18:
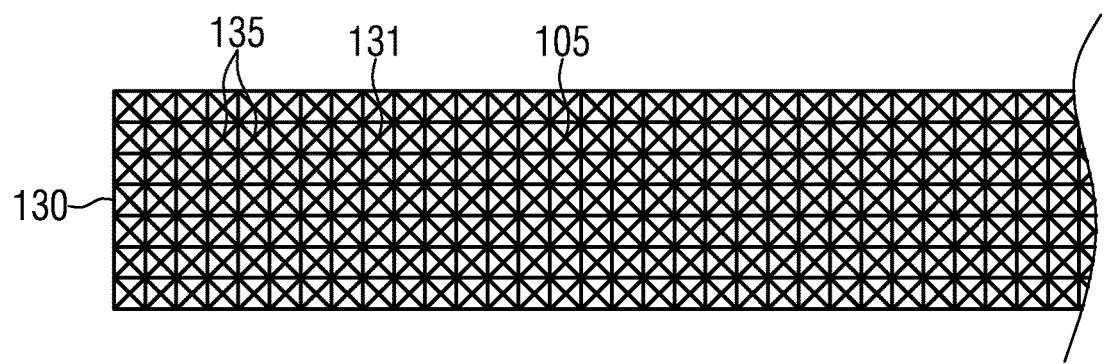
FIG. 18 schematically shows a plan view of the lower side of the carrier with pyramidal structures.

FIG. 16 shows a filament 100 in side view in which the scattering structure on the lower side 131 of the carrier has a pyramidal structure 135. FIG. 17 shows a cross section through the filament 100 of FIG. 16. In this case, FIG. 17 corresponds to FIG. 12 and FIG. 16 corresponds to FIG. 15, i.e. the pyramidal structure 135 is formed by the triangular recesses 134 of FIG. 12 being superimposed with the triangular recesses 134 of FIG. 15. It is, however, also possible to produce pyramidal structures 135 in which not all of the lower side 131 of the carrier is covered with pyramidal structures. FIG. 18 shows a plan view of the lower side 131 of the carrier 130, in which the pyramidal structures 135 are visible.

The examples of FIGS. 2 to 4 may be combined in any desired way with the examples of FIGS. 6 to 17.

Figure 19:
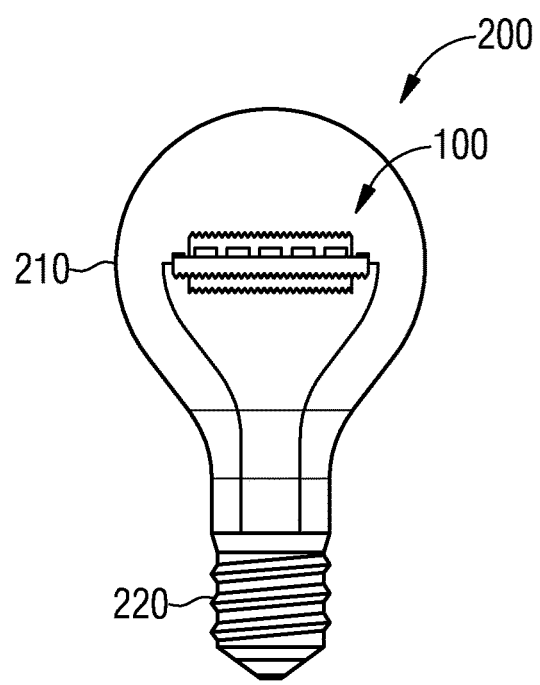
FIG. 19 schematically shows a lighting means with a filament.

FIG. 19 shows a lighting means 200 with a filament 100 corresponding to one of the filaments of FIGS. 1 to 17, an envelope 210 made of a light-transmissive material, and an electrical contacting 220 configured as a screw thread in a similar way to the screw thread of a conventional incandescent bulb. The electrical contacting 220 electrically conductively connects to the filament 100, and the envelope 210 is filled with a gas.

In one method of producing a filament 100, the converter 140 is produced by an injection-molding process. Structuring the surface 141 of the converter is carried out by the shape of the injection-molding tool. With this method, the filaments of FIGS. 2 to 4 can be produced.

In one method of producing a filament, structuring the lower side 131 of the carrier 130 is produced by a sawing, grinding, etching or laser-structuring process. The filaments of FIG. 1, and respectively 5 to 17, may be produced with the aid of this method.

Although our filaments, lighting means and methods have been illustrated and described in detail by preferred examples, this disclosure is not restricted to the examples disclosed, and other variants may be derived therefrom by those skilled in the art without departing from the protective scope of the appended claims.

This application claims priority of DE 10 2016 105 537.9, the subject matter of which is incorporated herein by reference.

The invention claimed is:

1. A filament comprising a multiplicity of light-emitting semiconductor chips, wherein the semiconductor chips are arranged on a carrier, the semiconductor chips being electrically contacted, a scattering structure is configured to scatter light of the light-emitting semiconductor chips, the scattering structure is formed by structuring a surface, a converter covers the light-emitting semiconductor chips, the structuring of the surface is formed on a surface of the converter, the converter encloses the carrier with the light-emitting semiconductor chips, the converter has a cylindrical shape, and the structuring of the surface is structuring of a lateral face of the cylindrical shape of the converter, the scattering structure of the lateral face has one or more indentations extending from the lateral face, and indentations are formed rotationally symmetrically about a cylinder axis.

2. The filament as claimed in claim 1, wherein the structuring of the lateral face is formed rotationally symmetrically about a cylinder axis.

3. The filament as claimed in claim 1, wherein the carrier comprises a material having a transmissivity for the light of the light-emitting semiconductor chips of at least 70%, a lower side of the carrier being a side of the carrier facing away from the semiconductor chips, wherein, additionally, the lower side and/or a side face of the carrier is structured.

4. The filament as claimed in claim 3, wherein the structuring of the lower side and/or of the side face of the carrier is formed by a convex shape or a concave shape of the lower side.

5. The filament as claimed in claim 3, wherein a first and a second electrical contact position are arranged respectively at an end of the carrier, the carrier having a first extent direction from the first contact position to the second contact position, and the lower side and/or the side face of the carrier having a recess parallel to the first extent direction.

6. The filament as claimed in claim 5, wherein the recess is triangular in cross section, the triangle being an isosceles triangle.

7. The filament as claimed in claim 5, wherein the carrier has a plurality of recesses which are triangular in cross section.

8. The filament as claimed in claim 3, wherein a first and a second electrical contact position are arranged respectively at an end of the carrier, the carrier having a first extent direction from the first contact position to the second contact position, and the lower side and/or the side face of the carrier having a plurality of recesses transversely to the first extent direction.

9. The filament as claimed in claim 3, wherein the structuring of the lower side and/or of the side face of the carrier has a pyramidal structure.

10. The filament as claimed in claim 9, wherein the entire lower side and/or side face of the carrier is covered with a plurality of pyramidal structures.

11. A lighting means comprising the filament as claimed in claim 1, an envelope made of a transparent material, and an electrical contacting, wherein the electrical contacting electrically conductively connects to the filament, and the envelope is filled with a gas.

12. A method of producing the filament as claimed in claim 1, wherein the converter is produced by an injection-molding method, the structuring of the surface of the converter being achieved by a shape of the injection-molding tool.

13. The filament as claimed in claim 1, wherein a width of the indentations is 0.2 to 2 millimeters.

14. The filament as claimed in claim 1, wherein a depth of the indentations is 0.2 to 2 millimeters.

15. The filament as claimed in claim 1, wherein the indentations have a triangular cross section.

16. The filament as claimed in claim 1, wherein the structuring of the surface of the converter has a size of 0.2 to 2 millimeters.

17. A filament comprising a multiplicity of light-emitting semiconductor chips, wherein the semiconductor chips are arranged on a carrier, the semiconductor chips being electrically contacted, a scattering structure is configured to scatter light of the light-emitting semiconductor chips, the scattering structure is formed by structuring a surface, a converter covers the light-emitting semiconductor chips, and the structuring of the surface is formed on a surface of the converter, the converter encloses the carrier with the light-emitting semiconductor chips, the converter has a cylindrical shape, the structuring of the surface is structuring of a lateral face of the cylindrical shape of the converter, the scattering structure of the lateral face has one or more indentations extending from the lateral face, indentations are formed rotationally symmetrically about a cylinder axis, and a width of the indentations is 0.2 to 2 millimeters.

18. The filament as claimed in claim 17, wherein a depth of the indentations is 0.2 to 2 millimeters.

19. The filament as claimed in claim 18, wherein the indentations have a triangular cross section.

20. The filament as claimed in claim 17, wherein the carrier comprises a material having a transmissivity for the light of the light-emitting semiconductor chips of at least 70%, a lower side of the carrier being a side of the carrier facing away from the semiconductor chips, wherein, additionally, the lower side and/or a side face of the carrier is structured, and the structuring of the lower side and/or of the side face of the carrier is formed by a convex shape or a concave shape of the lower side.

* * * * *